United States Patent
Otsuka (10) Patent No.: US 12,348,217 B2
(45) Date of Patent: Jul. 1, 2025

(54) FILTER DEVICE

(71) Applicant: Murata Manufacturing Co., Ltd., Nagaokakyo (JP)

(72) Inventor: Shintaro Otsuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 371 days.

(21) Appl. No.: 18/115,965

(22) Filed: Mar. 1, 2023

(65) Prior Publication Data

US 2023/0208397 A1  Jun. 29, 2023

Related U.S. Application Data

(63) Continuation of application No. PCT/JP2021/033127, filed on Sep. 9, 2021.

(30) Foreign Application Priority Data

Sep. 24, 2020  (JP) .................................. 2020-159744

(51) Int. Cl.
| | | |
|---|---|---|
| *H03H 9/64* | (2006.01) | |
| *H03H 9/145* | (2006.01) | |
| *H03H 9/25* | (2006.01) | |

(52) U.S. Cl.
CPC .............. *H03H 9/64* (2013.01); *H03H 9/145* (2013.01); *H03H 9/25* (2013.01)

(58) Field of Classification Search
CPC .......... H03H 9/1092; H03H 9/64; H03H 9/25; H03H 9/059; H03H 9/145; H01L 23/02
See application file for complete search history.

(56) References Cited

U.S. PATENT DOCUMENTS

| | | | |
|---|---|---|---|
| 11,437,563 B2 * | 9/2022 | Park ....................... | H10N 30/20 |
| 2009/0179524 A1 | 7/2009 | Saito | |

(Continued)

FOREIGN PATENT DOCUMENTS

| | | |
|---|---|---|
| JP | 2009171080 A | 7/2009 |
| JP | 2015008517 A | 1/2015 |

(Continued)

OTHER PUBLICATIONS

International Search Report in PCT/JP2021/033127, mailed Nov. 16, 2021, 3 pages.

(Continued)

*Primary Examiner* — Quan Tra
*Assistant Examiner* — Anh-Quan Tra
(74) *Attorney, Agent, or Firm* — Keating & Bennett, LLP (57) ABSTRACT

An insulating layer includes a cavity in a portion covering a conductive layer. A through conductor includes an insertion portion inside the cavity and a shoulder portion on a virtual boundary surface with the insertion portion when viewed in a direction parallel or substantially parallel to a main surface. The cavity is located alternately outside and inside an edge of the shoulder portion in a circumferential direction of the shoulder portion when viewed in a direction orthogonal or substantially orthogonal to the main surface. A portion between a portion of the cavity located outside the edge of the shoulder portion and the insertion portion is filled with a portion of the support when viewed in the direction orthogonal or substantially orthogonal to the main surface.

17 Claims, 6 Drawing Sheets

(56) References Cited

U.S. PATENT DOCUMENTS

| | | | |
|---|---|---|---|
| 2018/0151794 A1* | 5/2018 | Kuroyanagi | ............ H03H 3/08 |
| 2019/0044497 A1 | 2/2019 | Fukuda | |
| 2019/0181828 A1* | 6/2019 | Iwamoto | ............ H03H 9/02897 |
| 2020/0014369 A1 | 1/2020 | Kawasaki | |

FOREIGN PATENT DOCUMENTS

| | | | |
|---|---|---|---|
| JP | 2015146523 A | 8/2015 | |
| WO | 2018186240 A1 | 10/2018 | |
| WO | 2018198952 A1 | 11/2018 | |

OTHER PUBLICATIONS

Written Opinion in PCT/JP2021/033127, mailed Nov. 16, 2021, 3 pages.

* cited by examiner

FILTER DEVICE

CROSS REFERENCE TO RELATED APPLICATIONS

This application claims the benefit of priority to Japanese Patent Application No. 2020-159744 filed on Sep. 24, 2020 and is a Continuation Application of PCT Application No. PCT/JP2021/033127 filed on Sep. 9, 2021. The entire contents of each application are hereby incorporated herein by reference.

BACKGROUND OF THE INVENTION

1. Field of the Invention

The present invention relates to a filter device.

2. Description of the Related Art

Japanese Unexamined Patent Application Publication No. 2015-8517 and International Publication No. 2018/198952 disclose configurations of filter devices.

The acoustic wave device described in Japanese Unexamined Patent Application Publication No. 2015-8517 includes a substrate, an acoustic wave element, a pad, a cover, and a terminal. The acoustic wave element and the pad are provided on a main surface of the substrate. The main surface of the substrate and the acoustic wave element are covered with a protection layer. The pad is connected to the acoustic wave element. The cover has an inner wall surface that defines a portion of a vibration space in which the acoustic wave element is stored and an outer wall surface that does not face the vibration space. The terminal is provided on the pad and penetrates the cover in a vertical direction between the inner wall surface and the outer wall surface.

The filter device described in International Publication No. 2018/198952 includes a piezoelectric substrate, a functional element, a conductive layer, an insulating layer, a cover, a support layer, and a via conductor. The functional element is disposed on a surface of the piezoelectric substrate. The conductive layer is disposed on the surface of the piezoelectric substrate and is electrically connected to the functional element. The insulating layer is disposed at least on the conductive layer. The cover is disposed so as to face the surface of the piezoelectric substrate. The support layer is disposed between the surface of the piezoelectric substrate and the cover and forms a hollow portion in which the functional element is stored between the piezoelectric substrate and the cover. The via conductor penetrates the cover and the support layer and connects the insulating layer and the cover.

In the acoustic wave device described in Japanese Unexamined Patent Application Publication No. 2015-8517, there is a possibility that moisture enters the vibration space from outside along an interface between the cover and the protection layer. In a case where moisture enters the vibration space, reliability of the acoustic wave device decreases.

In the filter device described in International Publication No. 2018/198952, there is a possibility that moisture enters the hollow portion from outside along an interface between the support layer and the insulating layer. In a case where moisture enters the hollow portion, reliability of the filter device decreases.

SUMMARY OF THE INVENTION

Preferred embodiments of the present invention provide filter devices that each has improved reliability by reducing moisture entering a hollow portion.

A filter device according to a preferred embodiment of the present invention includes a piezoelectric substrate, a lid, a support, an insulating layer, and a through conductor. The piezoelectric substrate includes a main surface on which a functional element and a conductive layer electrically connected to the functional element are disposed. The lid faces the main surface with a gap interposed therebetween. The support is between the main surface and the lid and defines a hollow portion in which the functional element is stored together with the piezoelectric substrate and the lid. The insulating layer covers the functional element and the conductive layer. The through conductor penetrates the lid, the support, and the insulating layer and is connected to the conductive layer. The insulating layer includes a cavity in a portion covering the conductive layer. The through conductor includes an insertion portion inside the cavity and a shoulder portion on a virtual boundary surface with the insertion portion when viewed in a direction parallel or substantially parallel to the main surface. The cavity is successively located alternately outside and inside an edge of the shoulder portion in a circumferential direction of the shoulder portion when viewed in a direction orthogonal or substantially orthogonal to the main surface. A portion between a portion of the cavity located outside the edge of the shoulder portion and the insertion portion is filled with a portion of the support when viewed in the direction orthogonal or substantially orthogonal to the main surface.

According to each preferred embodiment of the present invention, it is possible to improve reliability of a filter device by reducing moisture entering a hollow portion.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings.

A filter device according to a preferred embodiment of the present invention is described below with reference to the drawings. In the following description of preferred embodiments of the present invention, the same or corresponding portions in the drawings are denoted by the same reference signs, and repeated description thereof is omitted.

The filter device is, for example, applied to a radio frequency (RF) circuit in communications equipment such as a mobile phone, for example. Examples of the filter device include a surface acoustic wave (SAW) filter and a bulk acoustic wave (BAW) filter.

The surface acoustic wave filter can be, for example, applied to a transmit filter and a receive filter of a duplexer. The surface acoustic wave filter applied to the transmit filter includes, for example, a plurality of one-port surface acoustic wave resonators. Each of the plurality of one-port surface acoustic wave resonators is connected in series or in parallel and thus define a serial arm resonator or a parallel arm resonator.

The filter device according to the present preferred embodiment is, for example, a ladder surface acoustic wave filter in which a plurality of serial arm resonators and a plurality of parallel arm resonators are connected in a ladder manner. A functional element that will be described later is a serial arm resonator or a parallel arm resonator in the surface acoustic wave filter.

Figure 1:
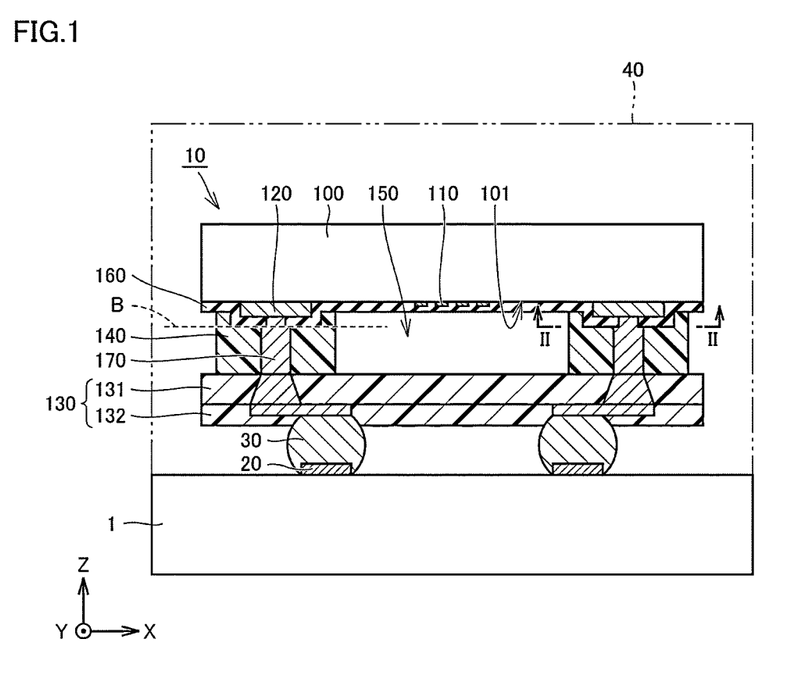
FIG. 1 is a cross-sectional view illustrating a configuration of a filter device according to a preferred embodiment of the present invention.

FIG. 1 is a cross-sectional view illustrating a configuration of the filter device according to the present preferred embodiment of the present invention. In the following description, it is assumed that a length direction of the filter device is an X-axis direction, a width direction of the filter device is a Y-axis direction, and a thickness direction of the filter device is a Z-axis direction. For easier understanding, some serial arm resonators, some parallel arm resonators, and wires connected to serial arm resonators or parallel arm resonators in a filter device 10 are not illustrated in FIG. 1.

As illustrated in FIG. 1, the filter device 10 according to the present preferred embodiment is mounted on a circuit board 1. The filter device 10 is, for example, flip-chip mounted on the circuit board 1. The filter device 10 is sealed by a sealing resin 40 such that a bump 30 of the filter device 10 is connected to a wire 20 provided on the circuit board 1. The bump 30 is, for example, made of lead-free solder.

The circuit board 1 is a multilayer body including a plurality of dielectric layers and a plurality of electrode layers. Each of the plurality of dielectric layers is, for example, made of ceramics such as alumina ($Al_2O_3$) or a resin. Circuit board 1 may be, for example, a ceramic multilayer board or a printed-wiring multilayer board made of a resin.

The filter device 10 according to the present preferred embodiment includes a piezoelectric substrate 100, a lid 130, a support 140, an insulating layer 160, and a through conductor 170.

The piezoelectric substrate 100 includes a main surface 101 on which a functional element 110 and a conductive layer 120 electrically connected to the functional element 110 are disposed. Specifically, for example, the piezoelectric substrate 100 has a rectangular or substantially rectangular parallelepiped shape and has a rectangular or substantially rectangular shape when viewed in the Y-axis direction. The main surface 101 is disposed on a side of the piezoelectric substrate 100 that faces the circuit board 1. A direction orthogonal or substantially orthogonal to the main surface 101 matches the Z-axis direction.

The piezoelectric substrate 100 is a crystal substrate having piezoelectricity such as, for example, lithium tantalate ($LiTaO_3$) or lithium niobate ($LiNbO_3$). For example, the piezoelectric substrate 100 may be made of piezoelectric ceramics alone or may be a substrate including a thin film having piezoelectricity on the main surface 101.

The functional element 110 includes a pair of comb-shaped electrodes (interdigital transducers (IDTs)). The functional element 110 is made of a conductor such as, for example, aluminum (Al), copper (Cu), nickel (Ni), gold (Au), or platinum (Pt). The functional element 110 may include two reflectors disposed on both sides of the pair of IDTs in a propagation direction of a surface acoustic wave.

Specifications of the functional element 110 such as electrode periods of the IDTs are set so that the functional element 110 has desired filter characteristics. A configuration of the functional element 110 is the same or substantially the same to a configuration of a typical surface acoustic wave resonator.

The conductive layer 120 is disposed on the main surface 101 of the piezoelectric substrate 100. The conductive layer 120 is electrically connected to the functional element 110 by a wire (not illustrated). The conductive layer 120 is, for example, made of a conductor such as Al, Cu, Ni, Au, or Pt.

The lid 130 faces the main surface 101 of the piezoelectric substrate 100 with a gap interposed therebetween. The lid 130 has a rectangular or substantially rectangular shape when viewed in the Y-axis direction. The lid 130 is made of an electric insulating material. The lid 130 is, for example, made of a resin such as an epoxy resin or a polyimide resin or an insulator such as $SiO_2$ or $Al_2O_3$.

The lid 130 according to the present preferred embodiment includes a first layer 131 and a second layer 132. The first layer 131 joins the second layer 132 and the support 140, which will be described later. The first layer 131 is, for example, made of an epoxy resin. The second layer 132 reduces or prevents moisture from entering an inside of the filter device 10. The second layer 132 is, for example, made of a polyimide resin.

The support 140 is disposed between the main surface 101 of the piezoelectric substrate 100 and the lid 130. The support 140 according to the present preferred embodiment has a rectangular or substantially rectangular shape when viewed in the Z-axis direction.

The support 140 defines a hollow portion 150 in which the functional element 110 is stored together with the piezoelectric substrate 100 and the lid 130. Specifically, to define the hollow portion 150, the support 140 is disposed on the main surface 101 so as to surround a region where the functional element 110 is provided. The support 140 is made of an electric insulating material. The support 140 is, for example, made of a polyimide resin.

The insulating layer 160 covers the functional element 110 and the conductive layer 120 on the main surface 101. The insulating layer 160 is, for example, made of an insulator such as $SiO_2$ or SiN.

The through conductor 170 penetrates the lid 130, the support 140, and the insulating layer 160 in the Z-axis direction and is connected to the conductive layer 120. The through conductor 170 is connected to the bump 30 at an end portion thereof on a side opposite to the conductive layer 120. The circuit board 1 and the conductive layer 120 are thus electrically connected to each other. The through conductor 170 is, for example, made of Cu.

Figure 2:
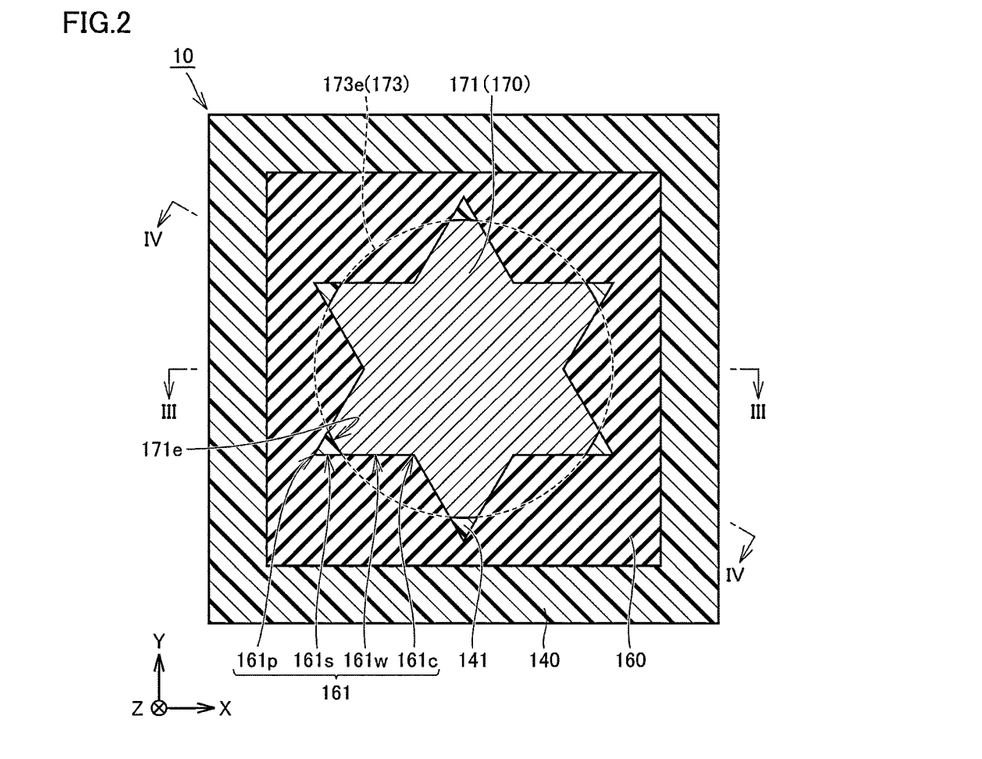
FIG. 2 is a cross-sectional view of the filter device of FIG. 1 taken along line II-II.
Figure 3:
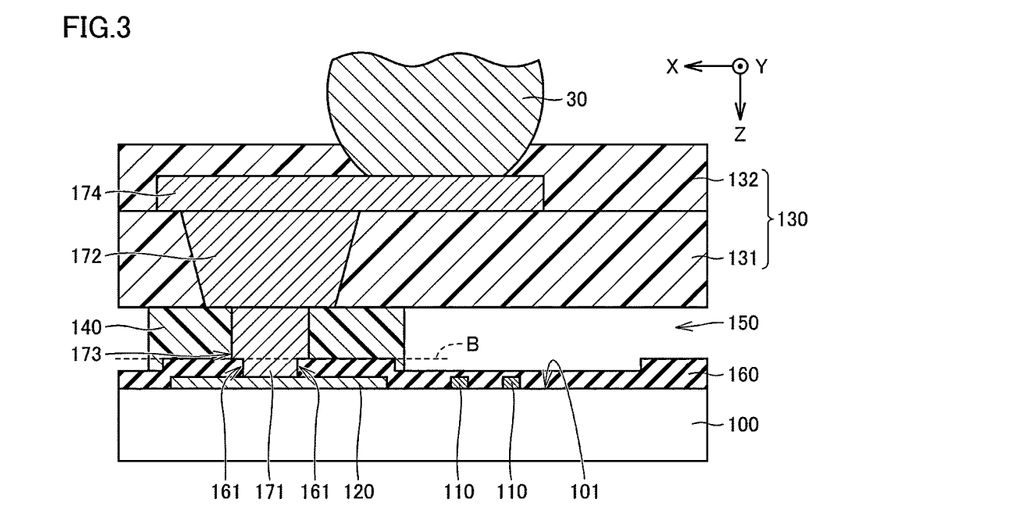
FIG. 3 is a cross-sectional view of the filter device of FIG. 2 taken along line III-III.
Figure 4:
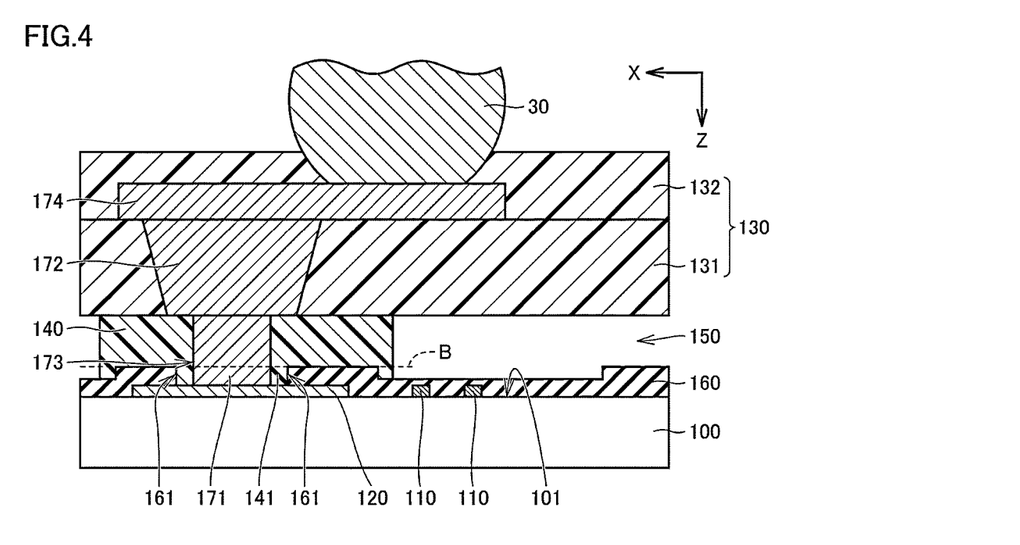
FIG. 4 is a cross-sectional view of the filter device of FIG. 2 taken along line IV-IV.

FIG. 2 is a cross-sectional view of the filter device of FIG. 1 taken along line II-II. FIG. 3 is a cross-sectional view of the filter device of FIG. 2 taken along line III-III. FIG. 4 is a cross-sectional view of the filter device of FIG. 2 taken along line IV-IV. FIGS. 3 and 4 illustrate the filter device 10 in a state obtained by reversing the filter device 10 in FIG. 1 in the Z-axis direction.

As illustrated in FIGS. 2 to 4, the insulating layer 160 has a rectangular or substantially rectangular outer shape when viewed in the Z-axis direction. The insulating layer 160 includes a cavity 161 in a portion covering the conductive layer 120.

As illustrated in FIG. 2, the cavity 161 has, for example, a star-shaped polygonal shape when viewed in a direction (the Z-axis direction) orthogonal or substantially orthogonal to the main surface 101. In the present preferred embodiment, the cavity 161 has, for example, a star-shaped hexagonal shape having six protruding portions 161p.

As illustrated in FIGS. 2 to 4, the through conductor 170 includes an insertion portion 171, a base portion 172, a shoulder portion 173, and a connection portion 174. The insertion portion 171 and the base portion 172 are adjacent to each other on a virtual boundary surface B. The insertion portion 171 is located on a conductive layer 120 side relative to the virtual boundary surface B and is located inside the cavity 161. The virtual boundary surface B according to the present preferred embodiment is a virtual boundary between the insertion portion 171 and the base portion 172 and is located at a same or substantially the same height as an end portion of the cavity 161 on a lid 130 side in the Z-axis direction.

A portion of the base portion 172 has a cylindrical or substantially cylindrical shape and penetrates the support 140 in the Z-axis direction. A remaining portion of the base portion 172 has a truncated cone shape that becomes thinner toward the support 140 in the Z-axis direction inside the lid 130 and penetrates the first layer 131.

The shoulder portion 173 is located on the virtual boundary surface B with the insertion portion 171 when viewed in a direction parallel or substantially parallel to the main surface 101. Specifically, the shoulder portion 173 is disposed on a lid 130 side relative to the virtual boundary surface B. The shoulder portion 173 is an end portion of the base portion 172 on an insulating layer 160 side in the Z-axis direction. The shoulder portion 173 is located above the cavity 161 in the Z-axis direction.

As illustrated in FIG. 2, an edge 173e of the shoulder portion 173 has a circular or substantially circular shape when viewed in the direction (the Z-axis direction) orthogonal or substantially orthogonal to the main surface 101. Since the shoulder portion 173 is located on the virtual boundary surface B, the edge 173e projected onto the virtual boundary surface B in the Z-axis direction is indicated by the dotted line in FIG. 2.

As illustrated in FIGS. 3 and 4, the connection portion 174 is disposed inside the second layer 132 of the lid 130. The connection portion 174 extends in the X-axis direction inside the second layer 132. The connection portion 174 is connected to the bump 30.

As illustrated in FIGS. 2 to 4, the cavity 161 is located alternately outside and inside the edge 173e of the shoulder portion 173 in a circumferential direction of the shoulder portion 173 when viewed in the direction (the Z-axis direction) orthogonal or substantially orthogonal to the main surface 101. Specifically, as illustrated in FIG. 2, the cavity 161 includes a protruding portion 161p, a corner portion 161c, an outer cavity 161s, and an inner cavity 161w.

The protruding portion 161p is located outside the edge 173e of the shoulder portion 173. The corner portion 161c is located inside the edge 173e of the shoulder portion 173. The protruding portion 161p and the corner portion 161c are alternately disposed in the circumferential direction of the shoulder portion 173.

The protruding portion 161p and the corner portion 161c are connected to each other by the outer cavity 161s and the inner cavity 161w. The outer cavity 161s is located outside the edge 173e of the shoulder portion 173. The inner cavity 161w is located inside the edge 173e of the shoulder portion 173. The outer cavity 161s and the inner cavity 161w continuously extend linearly between the protruding portion 161p and the corner portion 161c that are connected to each other.

The insertion portion 171 includes an end surface portion 171e that is periodically disposed in the circumferential direction of the shoulder portion 173 and is located on an identical circle to the edge 173e when viewed in the Z-axis direction. The insertion portion 171 is surrounded by the inner cavity 161w, the corner portion 161c, and the end surface portion 171e when viewed in the Z-axis direction. In this way, a part of the cavity 161 is filled with the insertion portion 171.

A portion between a portion of the cavity 161 that is located outside the edge 173e of the shoulder portion 173 and the insertion portion 171 is filled with a portion of the support 140 when viewed in the direction (the Z-axis direction) orthogonal or substantially orthogonal to the main surface 101. Specifically, a portion surrounded by the protruding portion 161p, the outer cavity 161s, and the end surface portion 171e is filled with a filling portion 141, which is a portion of the support 140. In this way, the cavity 161 according to the present preferred embodiment is filled with the filling portion 141, which is a portion of the support 140, and the insertion portion 171, which is a portion of the through conductor 170.

As a non-limiting example of a method for producing the support 140, the insulating layer 160, and the through conductor 170, first, the star-shaped hexagonal shape of the cavity 161 is formed by masking the insulating layer 160 with a resist and then etching the insulating layer 160. Next, the support 140 is formed on the insulating layer 160 including the cavity 161 by a photolithography method, for example. Next, a hole to be filled with the through conductor 170 is formed in the support 140 by irradiation of an electron beam or a photolithography method, for example. The through conductor 170 is formed by filling the inside of the cavity 161 and the hole of the support 140 with a conductor by electrolytic plating, for example.

Although the cavity 161 is a star-shaped hexagonal shape having the six protruding portions 161p in the present preferred embodiment, the number of protruding portions 161p is not limited to six and may be any number equal to or larger than three. Although inner angles of the six protruding portions 161p of the cavity 161 are equal or substantially equal to each other in the present preferred embodiment, the inner angles of the six protruding portions 161p of the cavity 161 are not limited to equal or substantially equal angles and may be different from each other. Although tip shapes of the six protruding portions 161p are pointed in the present preferred embodiment, the tip shapes may be rounded. Furthermore, although the cavity 161 includes the protruding portion 161p, the corner portion 161c, and the outer cavity 161s and the inner cavity 161w that extend linearly when viewed in the Z-axis direction in the present preferred embodiment, the cavity 161 may be formed in a circular or substantially circular manner by a wavy curve.

Figure 5:
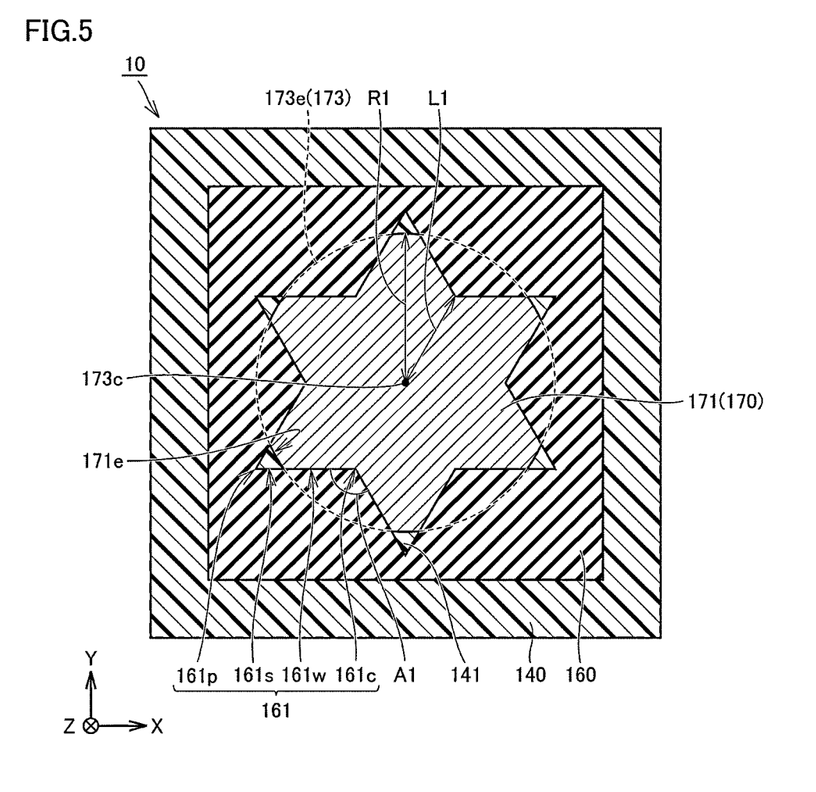
FIG. 5 is a cross-sectional view illustrating a positional relationship between an edge of a shoulder portion and a cavity in a filter device according to a preferred embodiment of the present invention.

FIG. 5 is a cross-sectional view illustrating a positional relationship between an edge of a shoulder portion and a cavity in the filter device according to the preferred embodiment of the present invention. FIG. 5 illustrates the same cross section as FIG. 2.

As illustrated in FIG. 5, an angle formed outside the star-shaped polygonal shape at a portion of the star-shaped polygonal shape of the cavity 161 that is located inside the edge 173e of the shoulder portion 173 is an obtuse angle. Specifically, an angle A1 formed outside the cavity 161 by two inner cavities 161w connected to a single corner portion 161c is an obtuse angle.

The shoulder portion 173 includes a center 173c and a radius R1. A dimension of a shortest distance between the center 173c of the edge 173e of the shoulder portion 173 and the cavity 161 is equal to or more than about 50% and less than about 100% of a dimension of the radius R1 of the circular or substantially circular shape when viewed in the direction (the Z-axis direction) orthogonal or substantially orthogonal to the main surface 101. In the present preferred embodiment, the dimension of the shortest distance between the center 173c and the cavity 161 is defined by a distance L1 between the center 173c and the corner portion 161c. That is, a dimension of the distance L1 is equal to or more than about 50% and less than about 100% of the dimension of the radius R1.

By thus defining the shape of the cavity 161, a decrease in function of the through conductor 170 is reduce or prevented. If the distance L1 is less than about 50% of the dimension of the radius R1, an area ratio of the insertion portion 171 inside the edge 173e of the shoulder portion 173 is low. Therefore, there is a possibility that a function of releasing heat generated by energization of the piezoelectric substrate 100 to the circuit board 1 by heat conduction of the through conductor 170 does not fully work.

Furthermore, in a case where the angle A1 of the corner portion 161c is an acute angle, there is a possibility that a crack occurs in portions of the through conductor 170 that are adjacent to the shoulder portion 173 and the corner portion 161c of the insertion portion 171 due to thermal stress occurring due to a difference in coefficient of linear expansion between the through conductor 170 and the insulating layer 160.

On the other hand, in a case where the outer cavity 161s is small, the protruding portion 161p is located outside and close to the end surface portion 171e, and the dimension of the distance L1 is close to 100% of the dimension of the radius R1, high positional accuracy is needed at a time of producing the through conductor 170 and the insulating layer 160, and difficulty of production becomes high. Therefore, the dimension of the distance L1 is preferably equal to or more than about 50% and equal to or less than about 90% of the dimension of the radius R1.

Figure 6:
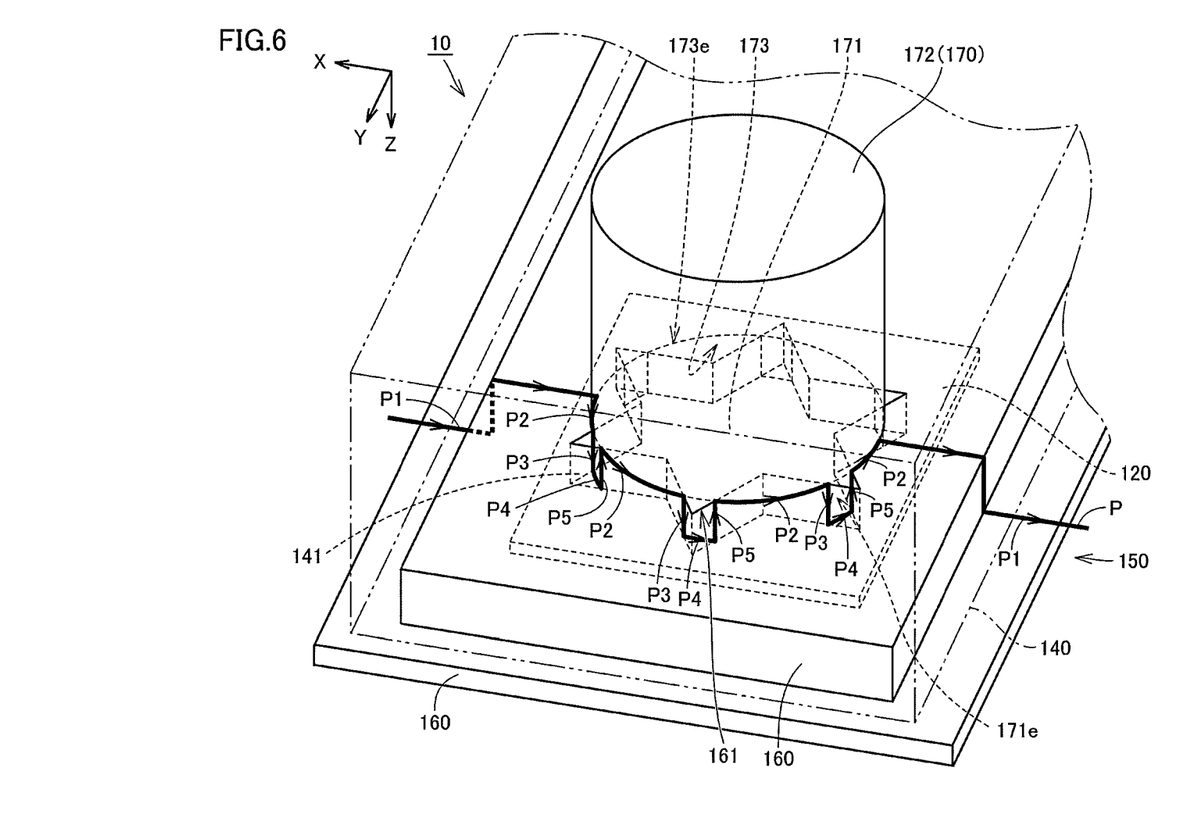
FIG. 6 is a perspective view illustrating a path of entry of moisture into a hollow portion of a filter device according to a preferred embodiment of the present invention.

FIG. 6 is a perspective view illustrating a path of entry of moisture into a hollow portion of the filter device according to the present preferred embodiment. One side of the Z-axis direction in FIG. 6 is a lower side in FIG. 6, and the other side of the Z-axis direction in FIG. 6 is an upper side in FIG. 6. In FIG. 6, the support 140 is transparent for easier understanding of the structure.

The filter device 10 according to the present preferred embodiment is, for example, a Wafer Level chip size Package (WLP) packaged in a wafer-level element size. In the WLP, it is important to reduce or prevent deterioration of filter characteristics of the filter device 10 caused by entry of moisture into the hollow portion 150.

One example of a path of entry of moisture into the filter device 10 is an interface of a structural member. In the present preferred embodiment, an interface between the support 140 and the insulating layer 160, an interface among the support 140, the insulating layer 160, and the through conductor 170, and an interface among the conductive layer 120, the support 140, and the through conductor 170 are paths of entry of moisture. Especially an interface between an organic substance (resin) and an inorganic substance is a main path of entry of moisture since a gap is provided by thermal stress caused by a difference in coefficient of linear expansion.

As illustrated in FIG. 6, in a case where moisture enters the hollow portion 150 of the filter device 10, moisture enters the hollow portion by passing through a path P including a main entry path defined by an interface between an organic substance (resin) and an inorganic substance. The path P includes a first path P1, a second path P2, a third path P3, a fourth path P4, and a fifth path P5.

Specifically, the first path P1 is a path passing an interface between the support 140 and the insulating layer 160. The second path P2 is a path passing an interface among the support 140, the through conductor 170, and the insulating layer 160 along the edge 173e of the shoulder portion 173. The third path P3 is a path passing an interface among the filling portion 141 of the support 140, the insertion portion 171 of the through conductor 170, and the insulating layer 160 toward one side in the Z-axis direction. The fourth path P4 is a path passing an interface among the conductive layer 120, the filling portion 141, and the insertion portion 171 along the end surface portion 171e. The fifth path P5 is a path passing an interface among the filling portion 141, the insertion portion 171, and the insulating layer 160 toward the other side in the Z-axis direction.

Moisture passes through the first path P1, the second path P2, the third path P3, the fourth path P4, and the fifth path P5 in this order from outside. Furthermore, by passing through the first path P1 on the hollow portion 150 side after repeatedly passing through the second path P2 to the fifth path P5, moisture reaches the hollow portion 150.

Paths of entry of moisture in the Z-axis direction such as the third path P3 and the fifth path P5 among these paths P are provided so that the cavity 161 is located alternately inside and outside the edge 173e when viewed in the Z-axis direction. Since a path of entry of moisture that extends along the edge 173e or the end surface portion 171e on an XY plane and meanders in the Z-axis direction is thus provided, a path of entry of moisture can be increased as compared to a case where the cavity 161 is located only outside the edge 173e when viewed in the Z-axis direction. A length of each of the third path P3 and the fifth path P5 is, for example, equal to or longer than about 30 nm and equal to or shorter than about 3 μm.

In the filter device 10 according to the present preferred embodiment, the cavity 161 of the insulating layer 160 is located alternately outside and inside the edge 173e of the shoulder portion 173 in the circumferential direction of the shoulder portion 173 when viewed in the direction (the Z-axis direction) orthogonal or substantially orthogonal to the main surface 101 of the piezoelectric substrate 100. A portion between a portion of the cavity 161 that is located outside the edge 173e of the shoulder portion 173 and the insertion portion 171 is filled with the filling portion 141, which is a portion of the support 140, when viewed in the direction (the Z-axis direction) orthogonal or substantially orthogonal to the main surface 101.

By thus causing moisture that enters the hollow portion 150 from outside to pass through the extended path P including a main path of entry defined by an interface between an organic substance (resin) and an inorganic substance, moisture entering the hollow portion 150 from the outside can be reduced, and thus reliability of the filter device 10 can be improved.

In the filter device 10 according to the present preferred embodiment, since the angle A1 of the corner portion 161*c* outside the star-shaped polygonal shape is an obtuse angle when viewed in the direction (the Z-axis direction) orthogonal or substantially orthogonal to the main surface 101, thermal stress caused by a difference in coefficient of linear expansion between the through conductor 170 and the insulating layer 160 can be dispersed as compared to a case where the angle A1 is an acute angle, and therefore occurrence of a crack in the through conductor 170 can be reduced or prevented.

In the filter device 10 according to the present preferred embodiment, since the shape of the edge 173*e* of the shoulder portion 173 of the through conductor 170 is a circular or substantially circular shape when viewed in the direction (the Z-axis direction) orthogonal or substantially orthogonal to the main surface 101 and the dimension of the distance L1 between the center 173*c* of the shoulder portion 173 and the cavity 161 is equal to or more than about 50% and less than about 100% of the dimension of the radius R1 of the shoulder portion 173 when viewed in the direction (the Z-axis direction) orthogonal or substantially orthogonal to the main surface 101, the function of releasing heat generated by energization of the piezoelectric substrate 100 to the circuit board 1 by heat conduction of the through conductor 170 can be maintained.

Filter devices according to modifications of a preferred embodiment of the present invention are described below. Since the filter devices according to the modifications of a preferred embodiment of the present invention are different from the filter device 10 according to the above-described preferred embodiment in configuration of a support, a through conductor, and an insulating layer, description of a configuration the same as or similar to the filter device 10 according to the above-described preferred embodiment is not repeated.

Figure 7:
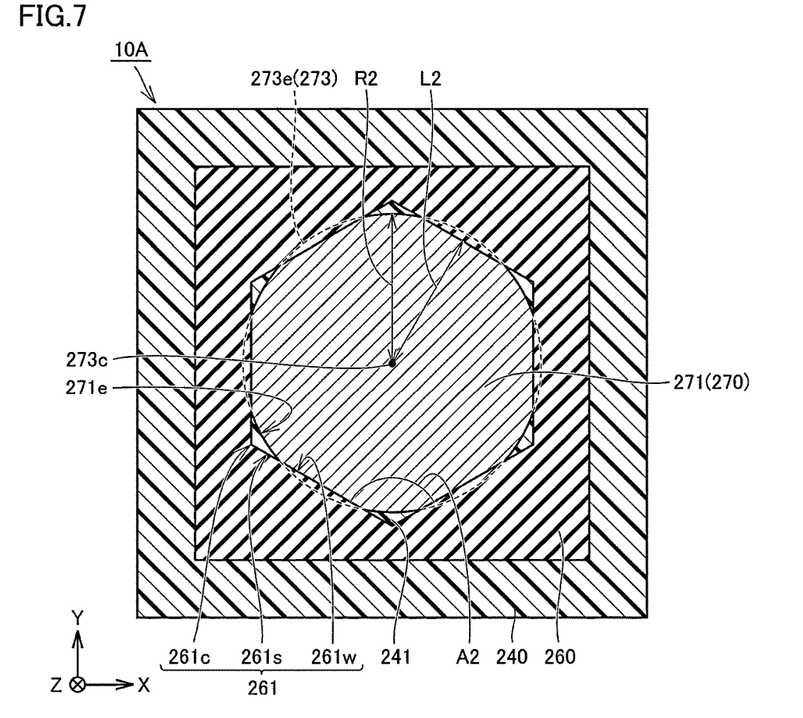
FIG. 7 is a cross-sectional view illustrating a configuration of a support, a through conductor, and an insulating layer of a filter device according to a first modification of a preferred embodiment of the present invention.

FIG. 7 is a cross-sectional view illustrating a configuration of a support, a through conductor, and an insulating layer of a filter device according to a first modification of a preferred embodiment of the present invention. FIG. 7 illustrates the same cross section as FIG. 5.

As illustrated in FIG. 7, a cavity 261 of an insulating layer 260 of a filter device 10A according to the first modification has a polygonal shape when viewed in the direction (the Z-axis direction) orthogonal or substantially orthogonal to the main surface 101. The cavity 261 of the insulating layer 260 of the filter device 10A according to the present modification has a regular hexagonal shape. The cavity 261 includes a corner portion 261*c*, an outer cavity 261*s*, and an inner cavity 261*w* when viewed in the direction (the Z-axis direction) orthogonal or substantially orthogonal to the main surface 101. An edge 273*e* of a shoulder portion 273 has a circular or substantially circular shape when viewed in the direction (the Z-axis direction) orthogonal to the main surface 101.

The outer cavity 261*s* is a portion of a side of the polygonal shape that is connected to the corner portion 261*c* and is located outside the edge 273*e* of the shoulder portion 273. The inner cavity 261*w* is a portion of a side of the polygonal shape that is sandwiched between the outer cavities 261*s* and is located inside the edge 273*e* of the shoulder portion 273.

An insertion portion 271 of a through conductor 270 includes an end surface portion 271*e* that is periodically disposed in the circumferential direction of the shoulder portion 273 and is located on a same or substantially a same circle as the edge 273*e* when viewed in the Z-axis direction. The insertion portion 271 is surrounded by the inner cavity 261*w* and the end surface portion 271*e* when viewed in the Z-axis direction. In this way, a portion of the cavity 261 is filled with the insertion portion 271.

A portion between a portion of the cavity 261 that is located outside the edge 273*e* of the shoulder portion 273 and the insertion portion 271 is filled with a portion of a support 240 when viewed in the Z-axis direction. Specifically, a portion surrounded by the corner portion 261*c*, the outer cavity 261*s*, and the end surface portion 271*e* is filled with a filling portion 241, which is a portion of the support 240. In this way, the cavity 261 according to the first modification is filled with the filling portion 241, which is a portion of the support 240, and the insertion portion 271, which is a portion of the through conductor 270.

An interior angle of the polygonal shape of the cavity 261 is an obtuse angle. Specifically, an interior angle A2 formed inside the polygonal shape by two outer cavities 261*s* connected to a single corner portion 261*c* is an obtuse angle.

The shoulder portion 273 includes a center 273*c* and a radius R2. A dimension of a shortest distance between the center 273*c* of the edge 273*e* of the shoulder portion 273 and the cavity 261 is equal to or more than about 50% and less than about 100% of a dimension of the radius R2 of the circular or substantially circular shape when viewed in the Z-axis direction. In the first modification, the dimension of the shortest distance between the center 273*c* of the edge 273*e* of the shoulder portion 273 and the cavity 261 is defined by a distance L2 between the center 273*c* and the inner cavity 261*w*. That is, the dimension of the distance L2 is equal to or more than about 50% and less than about 100% of the dimension of the radius R2.

Although the cavity 261 has a regular hexagonal shape in the first modification, the shape of the cavity 261 is not limited to a regular hexagonal shape and may be a polygonal shape having five or more corner portions, for example. Although all of the interior angles A2 of the cavity 261 are equal or substantially equal to each other, the interior angles A2 of the cavity 261 need not be equal to each other. Tips of the corner portions 261*c* of the polygonal shape may be rounded.

In the filter device 10A according to the first modification, since the interior angle A2 of the cavity 261 of the polygonal shape is an obtuse angle when viewed in the direction (the Z-axis direction) orthogonal or substantially orthogonal to the main surface 101, thermal stress caused due to a difference in coefficient of linear expansion between the through conductor 270 and the insulating layer 260 can be dispersed as compared with a case where the interior angle A2 is an acute angle, and therefore occurrence of a crack in the through conductor 270 can be reduced or prevented.

Figure 8:
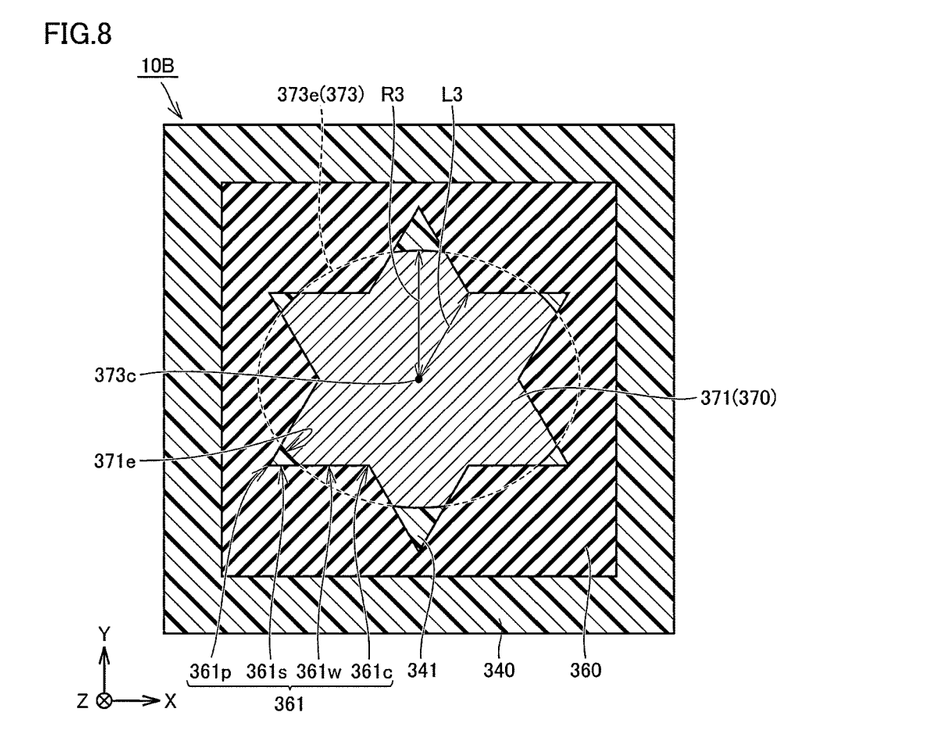
FIG. 8 is a cross-sectional view illustrating a configuration of a support, a through conductor, and an insulating layer of a filter device according to a second modification of a preferred embodiment of the present invention.

FIG. 8 is a cross-sectional view illustrating a configuration of a support, a through conductor, and an insulating layer of a filter device according to a second modification of a preferred embodiment of the present invention. FIG. 8 illustrates the same cross section as FIG. 5.

As illustrated in FIG. 8, an edge 373e of a shoulder portion 373 of a filter device 10B according to the second modification has an elliptical or substantially elliptical shape when viewed in the direction (the Z-axis direction) orthogonal or substantially orthogonal to the main surface 101.

A cavity 361 of an insulating layer 360 has a star-shaped polygonal shape when viewed in the direction (the Z-axis direction) orthogonal or substantially orthogonal to the main surface 101. In the present modification, the cavity 361 has a star-shaped hexagonal shape including six protruding portions 361p. The cavity 361 includes a protruding portion 361p, a corner portion 361c, an outer cavity 361s, and an inner cavity 361w.

An insertion portion 371 of a through conductor 370 includes an end surface portion 371e that is periodically disposed in the circumferential direction of the shoulder portion 373 and is located on a same or substantially a same circle as the edge 373e when viewed in the Z-axis direction. The insertion portion 371 is surrounded by the inner cavity 361w and the end surface portion 371e when viewed in the Z-axis direction. In this way, a portion of the cavity 361 is filled with the insertion portion 371.

A portion between a portion of the cavity 361 that is located outside the edge 373e of the shoulder portion 373 and the insertion portion 371 is filled with a portion of a support 340 when viewed in the Z-axis direction. Specifically, a portion surrounded by the protruding portion 361p, the outer cavity 361s, and the end surface portion 371e is filled with the filling portion 341, which is a portion of the support 340.

A dimension of a shortest distance between a center 373c of the edge 373e of the shoulder portion 373 and the cavity 361 is equal to or more than about 50% and less than about 100% of a dimension of a minor axis radius R3 of the elliptical or substantially elliptical shape when viewed in the Z-axis direction. In the second modification of the present preferred embodiment, the dimension of the shortest distance between the center 373c of the edge 373e of the shoulder portion 373 and the cavity 361 is defined by a distance L3 between the center 373c and the corner portion 361c. That is, the dimension of the distance L3 is equal to or more than about 50% and less than about 100% of the dimension of the minor axis radius R3.

A major-axis direction of the elliptic shape of the edge 373e of the shoulder portion 373 according to the second modification is directed in the X-axis direction, the major axis direction is not limited to the X-axis direction and may be, for example, directed in the Y-axis direction.

In the filter device 10B according to the second modification, since the shape of the edge 373e of the shoulder portion 373 of the through conductor 370 is an elliptical or substantially elliptical shape when viewed in the direction (the Z-axis direction) orthogonal or substantially orthogonal to the main surface 101 and the dimension of the distance L3 between the center 373c of the shoulder portion 373 and the cavity 361 is equal to or more than about 50% and less than about 100% of the dimension of the minor axis radius R3 of the shoulder portion 373 when viewed in the direction (the Z-axis direction) orthogonal or substantially orthogonal to the main surface 101, a function of releasing heat generated by energization of the piezoelectric substrate 100 to the circuit board 1 by heat conduction of the through conductor 370 can be maintained.

In the above description of preferred embodiments of the present invention and modifications, configurations that can be combined may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a piezoelectric substrate including a main surface on which a functional element and a conductive layer electrically connected to the functional element are provided;
   a lid facing the main surface with a gap interposed therebetween;
   a support between the main surface and the lid and defining a hollow portion in which the functional element is stored together with the piezoelectric substrate and the lid;
   an insulating layer covering the functional element and the conductive layer; and
   a through conductor penetrating the lid, the support, and the insulating layer and connected to the conductive layer; wherein
   the insulating layer includes a cavity in a portion covering the conductive layer;
   the through conductor includes an insertion portion inside the cavity and a shoulder portion on a virtual boundary surface with the insertion portion when viewed in a direction parallel or substantially parallel to the main surface;
   the cavity is successively located alternately outside and inside an edge of the shoulder portion in a circumferential direction of the shoulder portion when viewed in a direction orthogonal or substantially orthogonal to the main surface; and
   a portion between a portion of the cavity located outside the edge of the shoulder portion and the insertion portion is filled with a portion of the support when viewed in the direction orthogonal or substantially orthogonal to the main surface.

2. The filter device according to claim 1, wherein
   the cavity has a star-shaped polygonal shape when viewed in the direction orthogonal or substantially orthogonal to the main surface; and
   an angle outside the star-shaped polygonal shape at a portion of the star-shaped polygonal shape located inside the edge of the shoulder portion is an obtuse angle.

3. The filter device according to claim 1, wherein
   the cavity has a polygonal shape when viewed in the direction orthogonal or substantially orthogonal to the main surface; and
   an interior angle of the polygonal shape is an obtuse angle.

4. The filter device according to claim 1, wherein the edge of the shoulder portion has a circular or substantially circular shape or an elliptical or substantially elliptical shape when viewed in the direction orthogonal or substantially orthogonal to the main surface.

5. The filter device according to claim 4, wherein
   the edge of the shoulder portion has the circular or substantially circular shape when viewed in the direction orthogonal or substantially orthogonal to the main surface; and
   a dimension of a shortest distance between a center of the edge of the shoulder portion and the cavity is equal to or more than about 50% and less than about 100% of a dimension of a radius of the circular or substantially circular shape when viewed in the direction orthogonal or substantially orthogonal to the main surface.

6. The filter device according to claim 1, wherein the piezoelectric substrate includes $LiTaO_3$ or $LiNbO_3$.

7. The filter device according to claim 1, wherein the functional element includes a pair of comb-shaped electrodes.

8. The filter device according to claim 1, wherein the functional element includes Al, Cu, Ni, Au, or Pt.

9. The filter device according to claim 1, wherein the conductive layer is connected to the functional element by a wire.

10. The filter device according to claim 1, wherein the conductive layer includes Al, Cu, Ni, Au, or Pt.

11. The filter device according to claim 1, wherein the lid includes an epoxy resin, a polyimide resin, $SiO_2$, or $Al_2O_3$.

12. The filter device according to claim 1, wherein the lid includes a first layer and a second layer.

13. The filter device according to claim 12, wherein the first layer includes an epoxy resin.

14. The filter device according to claim 12, wherein the second layer includes a polyimide resin.

15. The filter device according to claim 1, wherein the support includes a polyimide resin.

16. The filter device according to claim 1, wherein the insulating layer includes $SiO_2$ or SiN.

17. The filter device according to claim 1, wherein the through conductor includes Cu.

\* \* \* \* \*